United States Patent [19]

Shou et al.

[11] Patent Number: 5,754,134
[45] Date of Patent: May 19, 1998

[54] APPARATUS FOR PERFORMING SUCCESSIVE STEPS OF SIMULTANEOUS MULTI-LEVEL ANALOG TO DIGITAL CONVERSION

[75] Inventors: Guoliang Shou; Kazunori Motohashi; Makoto Yamamoto; Sunao Takatori, all of Tokyo, Japan

[73] Assignees: Yozan Inc., Tokyo; Sharp Kabushiki Kaisha, Osaka, both of Japan

[21] Appl. No.: 534,869

[22] Filed: Sep. 27, 1995

[30] Foreign Application Priority Data

Sep. 30, 1994 [JP] Japan .................. 6-261613

[51] Int. Cl.$^6$ .................. H03M 1/40
[52] U.S. Cl. .................. 341/163; 341/155; 341/162; 341/172
[58] Field of Search .................. 341/155, 156, 341/161, 162, 163, 169, 172

[56] References Cited

U.S. PATENT DOCUMENTS 4,989,004  1/1991  Kanayama .................. 341/161
5,252,976 10/1993  Miho et al. .................. 341/163

FOREIGN PATENT DOCUMENTS 124624    5/1988  Japan .................. 341/161
403278717 12/1991  Japan .................. 341/161

OTHER PUBLICATIONS

Ogawa et al., "Development of 1 Chip SS Communication LSI Using Digital Matched Filters", Technical Report of IECE, ISEC94-42, SST94-65 (Dec. 1994), pp. 33–38.

"Dual 64–Tap, 11 Mcps, Digital Matched Filter/Correlator", Stel-3310, Stanford Telecommunications.

Primary Examiner—Jeffrey A. Gaffin
Assistant Examiner—Jason H. Vick
Attorney, Agent, or Firm—Cushman Darby & Cushman IP Group of Pillsbury Madison & Sutro LLP

[57] ABSTRACT

An A/D converter including a first inverter having a linear characteristic and receiving an analog input voltage, a first quantizing circuit for quantizing the analog input voltage, a capacitive coupling to which an output of the first inverter and the first quantizing circuit are inputted, a second inverter receiving an output of the capacitive coupling and having the same characteristic of the first inverter, and a second quantizing circuit for receiving and quantizing an output of the second inverter. The A/D converter performs successive steps of quantizing/digitizing so as to achieve A/D conversion.

6 Claims, 3 Drawing Sheets

APPARATUS FOR PERFORMING SUCCESSIVE STEPS OF SIMULTANEOUS MULTI-LEVEL ANALOG TO DIGITAL CONVERSION

FIELD OF THE INVENTION

The present invention relates to an A/D converter for converting an analog voltage to a multi-bit digital output voltage.

BACKGROUND OF THE INVENTION

The inventors of the present invention have proposed an A/D converter circuit in Japanese Patent Application Hei No. 06-8784 and U.S. patent application Ser. No. 08/261, 904. The A/D converter, as shown in FIG. 5, has a plurality of thresholding circuits 11 to 13 with different and stepwise threshold voltages. Each thresholding circuit receives an analog input voltage A. Each thresholding circuit also receives outputs from higher level thresholding circuits. For example, the thresholding circuit 13 receives the input voltage A and the outputs of thresholding circuits 11 and 12. Each thresholding circuit outputs an inverted or noninvented output in response to the value of the input voltage A and whether the higher level thresholding circuit, and the output from that higher level thresholding circuit, is periodically changed along with increases in the input voltage.

The outputs of the thresholding circuits correspond to bits of the digital output, which are summed with weighting by a capacitive coupling so that a discrete or quantized analog voltage is obtained corresponding to the input voltage.

The accuracy of the A/D converter circuit depends upon thresholding accuracy of each thresholding circuit and upon accuracy of capacitive coupling for summing the outputs of the thresholding circuits. It is rather difficult to control the accuracy of these parts during the LSI manufacturing process.

SUMMARY OF THE INVENTION

The present invention has an object to solve the conventional problems and to provide an A/D converter circuit for generating a highly accurate digital output.

An A/D converter circuit according to the present invention performs successive steps of digitizing, the analog input voltage is subtracted from each digitized output for the next input of digitizing.

According to the present invention, it is possible to make the accuracy of the final output high by digitizing the LSB of the digitized data in the next step. Each digitizing step generates an output having digitizing accuracy that is equal relative to the digitizing accuracy of other steps.

PREFERRED EMBODIMENT OF THE PRESENT INVENTION

Hereinafter, an embodiment of an A/D converter circuit according to the present invention is described with referring to the attached drawings.

Figure 1:
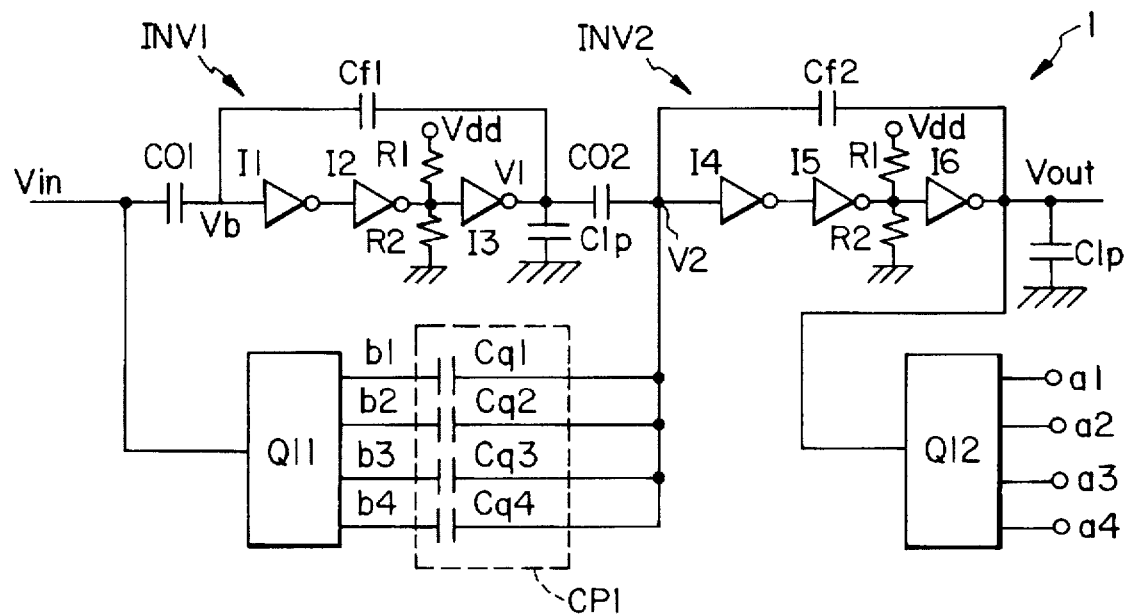
FIG. 1 is a circuit diagram showing the first embodiment of A/D converter according to the present invention.

In FIG. 1, an A/D converter circuit has two sequential inverted amplifiers INV1 and INV2 each having a feedback capacitance, represented respectively by Cf1 and Cf2, for feeding an output of each amplifier back to an input of the same amplifier. A coupling capacitance C01 is connected to an input terminal of INV1 to which an analog input voltage Vin is connected. A coupling capacitance C02 is connected between an output terminal of INV1 and input terminal of INV2. The output of INV1 is connected to INV2 through C02.

INV1 and INV2 consist of 3 stages of MOS inverters: inverters I1, I2 and I13 for INV1 and inverters I4, I5 and I6 for INV2. The inverters for INV1 and INV2 have a high gain resulting from a product of open gains of these inverters of 3 stages. The voltage of the output of the INV1, designated by V1, is determined by a ratio of C01 and Cf1, as shown by the formula 1.

FORMULA 1

$$V1 = \frac{C01(Vin - Vb)}{Cf1} + Vb \quad (1)$$

Besides the signal line through the inverters INV1 and INV2, a quantizing circuit is formed in parallel with the inverter INV1. Before reaching the capacitance C01, the input voltage Vin is branched and inputted to the quantizing circuit Q11. The output generated by quantizing circuit Q11 is inputted to INV2 through capacitive coupling CP1. Quantizing circuit Q11 converts Vin into a binary number of a plurality of bits (4 bits in the present embodiment), and outputs binary bits b1, b2, b3 and b4 after integrating them using the capacitive coupling CP1.

Capacitive coupling CP1 has capacitances Cq1, Cq2, Cq3 and Cq4 for receiving the binary bits from b1 to b4. Outputs from both Cp1 and C02 are parallelly inputted to INV2. When input voltage of INV2 is defined as V2 and output voltage from INV2 is defined as V0, then the following formula 2 is obtained.

FORMULA 2

$$Vo - V2 = \left\{ (V1 - V2)C02 + \sum_{i=1}^{4} (biVdd = V2)Cqi \right\} / Cf2 \quad (2)$$

Here, a unit capacitance Cu can be defined as the minimum capacity shaped in LSI, with relationships that C01= C02= Cf1= 16Cu, Cf2= Cu, Cq1= Cu, Cq2= 2Cu, Cq3= 4Cu and Cq4= 8Cu, then Formula 3 is obtained.

FORMULA 3

$$Vo = 16 \left\{ Vin - \sum_{i=1}^{4} 2^{i-1}biVdd.16 \right\} \quad (3)$$

The formula (3) means that binarized data Vin of 4 bits is subtracted from the analog data Vin. The output Vo of INV2 is an analog data corresponding to lower 4 bits, while the digital data from Q11 is higher 4 bits.

V0 is inputted to the second quantizing circuit Q12 which performs the second stage binarization of 4 bits. Q12 outputs a binarized data consisting of 4 bits a1, a2, a3 and a4. This data represents the lower 4 bit of Vin.

Hereinafter, the quantizing circuit Q11 is described. Since the quantizing circuits Q11 and Q12 are similar to each other, only Q11 is described referring to FIG. 2.

Figure 2:
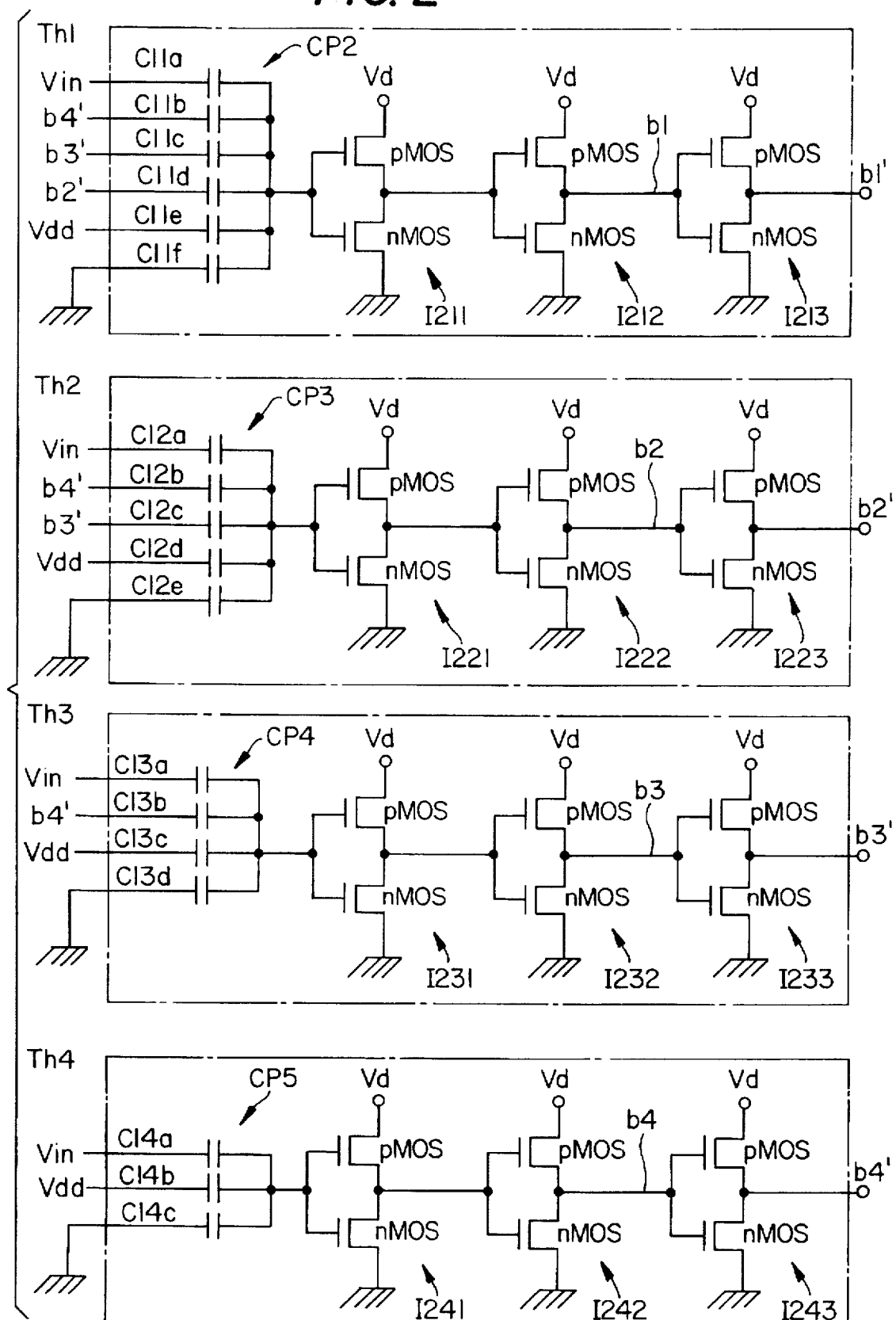
FIG. 2 is a circuit diagram of a quantizing circuit in FIG. 1.

Quantizing circuit Q11 is composed of the tour thresholding circuits Th1 to Th4 shown in FIG. 2, which generate outputs b1, b2, b3 and b4, respectively. Inverted outputs b1', b2', b3'and b4'of the outputs b1 to b4 are generated as intermediate data inside.

In FIG. 2, the lowest thresholding circuit Th1 has capacitive coupling CP2 receiving Vin, b2', b3'and b4'. Three stages sequential inverters I211, I212, I213 are connected to an output of CP2. The output b1 is generated as an output of inverter I212 of second stage. An inverted output b1'is generated as an output of inverter I213 of the final stage.

CP2 consists of capacitances C11a, C11b, C11c, C11d, C11e and C11f which are connected to Vin, b4', b3', b2', Vdd and the ground, respectively. Vdd is the reference voltage Vdd for controlling a threshold value of INV31. The voltage of the ground is provided for controlling the total capacity of CP2.

Thresholding circuit Th2 has the second lowest thresholding; it is the next highest threshold from the minimum thresholding circuit Th1. Thresholding circuit Th2 has capacitive coupling CP3 receiving Vin, b3'and b4'. Three stage sequential inverters I221, I222 and I223 are connected to an output of CP3. An output b2 is generated as an output inverter I222 of the second stage. An inverted output b2'is generated as an output of the final inverter I223.

CP3 consists of capacitances C12a, C12b, C12c, C12d and C12e which are connected to Vin, b4', b3', Vdd and the ground, respectively. Vdd is the reference voltage for controlling a thresholding value of INV41. The voltage of the ground is provided for controlling the total capacity of CP3.

Thresholding circuit Th3 has the third lowest threshold; it is the next highest thresholding from thresholding circuit Th2. Thresholding circuit Th3 has capacitive coupling CP4 receiving Vin'and b4'. Three stage sequential inverters I231, I232 and I233 are connected to an output of CP4. An output B3 is generated as an output of inverter I232 of the second stage. An inverted output b3 is generated as an output of inverter I232 of the second stage. An inverted output b3'is generated as an output of the final inverter I233. CP4 consists of capacitances C13a, C13b, C13c and C13 which are connected to Vin, b4', Vdd and the ground, respectively. Vdd is the reference voltage for controlling thresholding value INV51. The voltage of the ground is provided for controlling total capacity of CP4.

Thresholding circuit Th4 has the highest threshold. Thresholding circuit Th4 has capacitive coupling CP5 receiving Vin. Three stage sequential inverters I241, I242 and I243 are connected to an output of CP5. An output b4 is generated as an output of inverter 1242 of the second stage. An inverted output b4'is generated as an input of the final inverter 1243. CP5 consists of capacitances C14a, C14b and C14c which are connected to Vin, Vdd and the ground, respectively. Vdd is the reference for controlling a thresholding value of INV61. The voltage of the ground is provided for controlling the total capacity of CP5.

A capacity of each capacitance of CP2 to CP5 is shown in TABLE 1, and a relationships between Vin and the outputs b1, b2, b3 and b4 and a relationship between Vin and intermediate outputs b1', b2', b3'and b4'are shown in TABLE 2. It is not necessary that Cu in Table 1 is the minimum capacity. Any other capacity can be used if that capacity is common for all capacitances in every capacitive coupling TABLE 2 shows voltage (Vdd/16) as Va.

TABLE 1

| CAPACITIVE COUPLING | CAPACITANCE | CAPACITY |
|---|---|---|
| CP2 | C11a | 16 Cu |
|  | C11b | 8 Cu |
|  | C11c | 4 Cu |

TABLE 1-continued

| CAPACITIVE COUPLING | CAPACITANCE | CAPACITY |
|---|---|---|
|  | C11e | 2 Cu |
|  | C11d | Cu |
|  | C11f | Cu |
| CP3 | C12a | 8 Cu × 2 |
|  | C12b | 4 Cu × 2 |
|  | C12c | 2 Cu × 2 |
|  | C12d | Cu × 2 |
|  | C12e | Cu × 2 |
| CP4 | C13a | 4 Cu × 4 |
|  | C13b | 2 Cu × 4 |
|  | C13c | Cu × 4 |
|  | C13d | Cu × 4 |
| CP5 | C14a | 2 Cu × 8 |
|  | C14b | Cu × 8 |
|  | C14c | Cu × 8 |

TABLE 2

| INPUT VOLTAGE | INTERMEDIATE VOLTAGE | | | | OUTPUT | | | |
|---|---|---|---|---|---|---|---|---|
| in | b1' | b2' | b3' | b'4 | b1 | b2 | b3 | b4 |
| 0 ≦ Vin < Va | Vdd | Vdd | Vdd | Vdd | 0 | 0 | 0 | 0 |
| Va ≦ Vin < 2Va | 0 | Vdd | Vdd | Vdd | Vdd | 0 | 0 | 0 |
| 2Va ≦ Vin < 3Va | Vdd | 0 | Vdd | Vdd | 0 | Vdd | 0 | 0 |
| 3Va ≦ Vin < 4Va | 0 | 0 | Vdd | Vdd | Vdd | Vdd | 0 | 0 |
| 4Va ≦ Vin < 5Va | Vdd | Vdd | 0 | Vdd | 0 | 0 | Vdd | 0 |
| 5Va ≦ Vin < 6Va | 0 | Vdd | 0 | Vdd | Vdd | 0 | Vdd | 0 |
| 6Va ≦ Vin < 7Va | Vdd | 0 | 0 | Vdd | 0 | Vdd | Vdd | 0 |
| 7Va ≦ Vin < 8Va | 0 | 0 | 0 | Vdd | Vdd | Vdd | Vdd | Vdd |
| 8Va ≦ Vin < 9Va | Vdd | Vdd | Vdd | 0 | 0 | 0 | 0 | Vdd |
| 9Va ≦ Vin < 10Va | 0 | Vdd | Vdd | 0 | Vdd | 0 | 0 | Vdd |
| 10Va ≦ Vin < 11Va | Vdd | 0 | Vdd | 0 | 0 | Vdd | 0 | Vdd |
| 11Va ≦ Vin < 12Va | 0 | 0 | Vdd | 0 | Vdd | Vdd | 0 | Vdd |
| 12Va ≦ Vin < 13Va | Vdd | Vdd | 0 | 0 | 0 | 0 | Vdd | Vdd |
| 13Va ≦ Vin < 14Va | 0 | Vdd | 0 | 0 | Vdd | 0 | Vdd | Vdd |
| 14Va ≦ Vin < 15Va | Vdd | 0 | 0 | 0 | 0 | Vdd | Vdd | Vdd |
| 15Va ≦ Vin < 16Va | 0 | 0 | 0 | 0 | Vdd | Vdd | Vdd | Vdd |

The above quantizing circuit Q11 generates outputs b1 to b4, and outputs a1 to a4 are generated by Q12 in the same way. Then, analog to digital conversion is realized. The quantizing circuit Q12 generates the lower 4 bits of the digitized data so that a highly accurate digital output can be generated even when capacitances of capacitive couplings are not so high in the accuracy. Using multiple stages of quantizing circuits, highly accurate digital outputs can be easily obtained.

The outputs of the thresholding circuits Th1 to Th4 change sharply due to the high gain of the multi-stage inverters. If four stages inverters are applied instead of the three stages of FIG. 2, sharpness is increased. In this case, outputs b1 to b4 are obtained from the final stage inverters.

Figure 3:
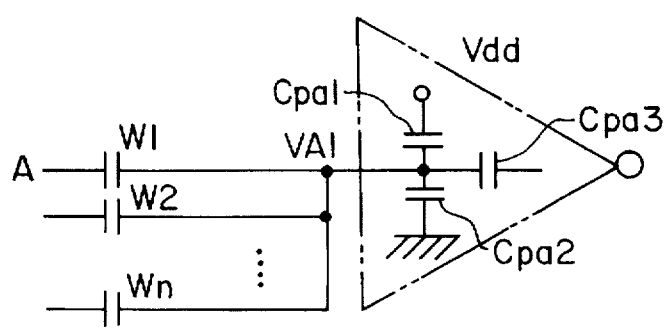
FIG. 3 is a equivalent circuit showing the influence of parasitic capacity.

In the Table 1, the total capacity value of capacitances in the capacitive couples are equal to one another so that the influence of parasitic capacity of inverters I211, I221, I231 and I241 is negligible. In FIG. 3, if the parasitic capacitances of inverters are Cpa1 at the power source side, Cpa2 at the ground side, and Cpa3 at the output side, the capacity of the capacitive coupling connected to an input of the inverters are W1 to Wn, and the input voltage to these capacitances are V1 to Vn, then the input voltage VA1 to an inverter caused by the input voltage A(=V1) is defined as in FORMULA 4.

FORMULA 4

$$VA1 = \left\{ \sum_{i=1}^{n} WiVi + Cpa1Vdd + Cpa2x0 + Cpa3Voo \right\} / \left\{ \sum_{i=1}^{n} Wi + Cpa1 + Cpa2 + Cpa3 \right\} \quad (4)$$

FORMULA 5

$$Voo = 0 \quad (5)$$

FORMULA 6

$$Wdd = \sum_{i=2}^{n} Wi + Cpa1 \quad (6)$$

FORMULA 7

$$VA1 = (W1V1 + WddVdd)/(W1 + Wdd + Cpa2 + Cpa3) \quad (7)$$

Since the ratio of Cpa1 in Wdd is small and deviation of the parasitic capacity is generally small, VA1 is not influenced by the parasitic capacity as long as the total capacity (W1+Wdd) of the capacitive coupling is constant.

The circuit of FIG. 1 includes a low-pass capacitance C1p and equilibrium resistances R1 an R2. These components help that circuit to prevent unstable oscillation of the inverter circuit. In the figure, R1 and R2 are connected at a point between the second and the third inverters. It is also possible to connect the resistances of a point between the first and the second inverters. The resistance R1 is connected to the power source Vdd and R2 is connected to the ground. The high-pass capacitance is connected between the output of the inverter and the ground.

Figure 4:
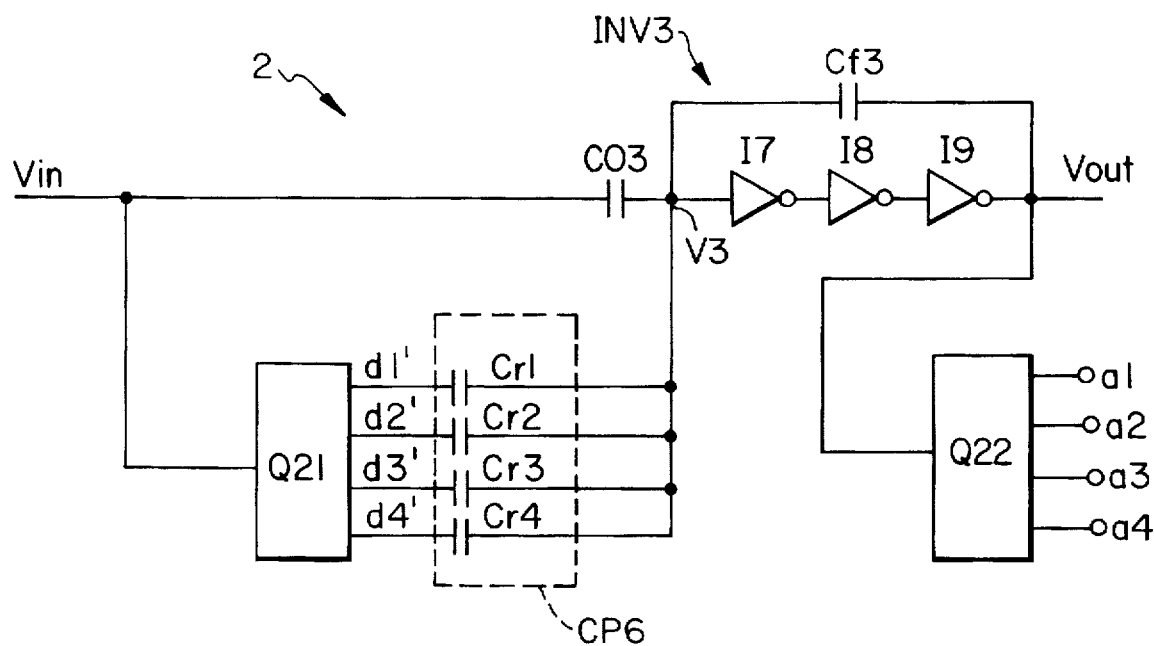
FIG. 4 is a block diagram showing the second embodiment of the present invention.
Figure 5:
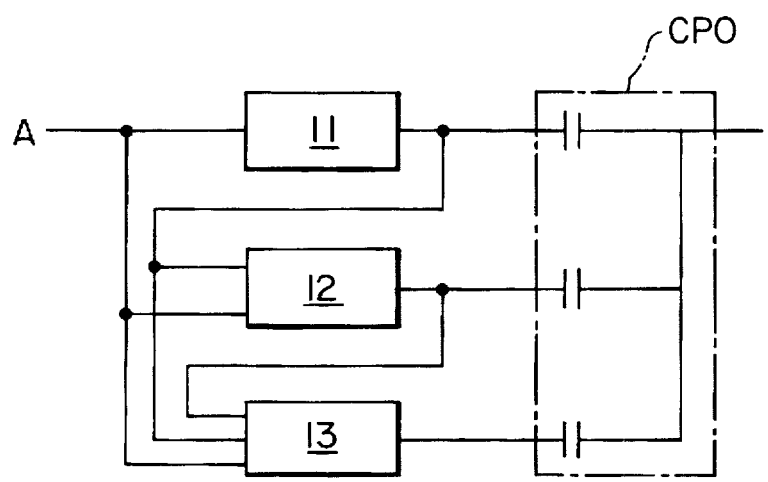
FIG. 5 is a block diagram showing the conventional A/D converting Circuit.

FIG. 4 is the second embodiment of the present invention, in which the first stage inverted amplifier of the first embodiment is omitted. An A/D converter 2 has an inverted amplifier INV3, an output of which is connected to its input through a feedback capacitance Cf3. The input terminal of INV3 is connected to a coupling capacitance C03 and the analog input voltage Vin is connected to C03. INV3 is composed of inverters I7 to I9 of three stages and has a large gain given by a multiplication of these inverters' open gain.

Input voltage Vin is inputted to quantizing circuit Q21 after branching in the front stage of C03, and an output of Q21 is inputted to INV3 through a capacitive coupling CP6. Q21 converts Vin into a binary number of 4 bits (d4, d3, d2 and d1), and binary bits of its inverted output d1', d2', d3'and d4'are integrated by the capacitive coupling CP6. The capacitive coupling CP6 has capacitances C41, Cr2, Cr3 and Cr4 which receive d1', d2', d3'and d4', respectively. Outputs of C03 and C06 are parallelly inputted to INV3. When an input voltage of INV3 is V3 and an output of it is Vo, formula 8 is obtained.

FORMULA 8

$$Vo - V3 = -\left[ \sum_{i=1}^{4} Cri\{(1 - di)Vdd - V3\} - C03(Vin - V3) \right] /Cf3 \quad (8)$$

Here, if a unit capacitance is Cu, C03= 16Cu, Cf3= Cu, Cr1= Cu, Cr2=2Cu, Cr3=4Cu, Cr4=8Cu, then formula 7 is obtained.

FORMULA 9

$$Vo = Vd - 16 \left\{ Vin - \sum_{i=1}^{4} 2^{i-1}diVdd/16 \right\} \quad (9)$$

The formula (9) means that binarized data Vin of 4 bits is subtracted from the analog data Vin. The output of Vo of INV3 is an analog data corresponding to the lower 4 bits, while the digital data from Q21 corresponds to the higher 4 bits.

V0 is inputted to the second quantizing circuit Q22 which performs the second stage binarization of 4 bits. Q12 outputs a binarized data consisting of 4 bits a1, a2, a3 and a4. These data is the lower 4 bit of Vin.

Quantizing circuit Q21 is similarly constructed to the quantizing circuit Q11, and the outputs of the final stage of the thresholding circuits are outputted as d1'to d4'. They are inputted to other thresholding circuit as intermediate data. The quantizing circuit Q22 is similar to Q11 the outputs a1, a2, a3 and a4 of the final stage are inputted to other thresholding circuits.

According to the second embodiment, the same performance is obtained as the first embodiment with a circuit of small size.

The present invention solves the above-mentioned conventional problems faced by the conventional A/D converter circuit. The present invention performs successive steps of digitizing, subtracting an analog input voltage from each digitized output for the next input of digitizing. As such, the present invention provides an A/D converter circuit for generating a highly accurate digital output.

What is claimed is:

1. An A/D converter comprising:
   a first inverter having a linear characteristic and receiving an analog input voltage that includes a first and a second portion;
   a first quantizing circuit receiving said analog input voltage and quantizing said first portion of said analog input voltage;
   a first capacitive coupling receiving outputs from said first inverter and said first quantizing circuits and out putting said second portion of said analog input voltage;
   a second inverter receiving said output from said first capacitive coupling, said second inverter having a linear characteristic corresponding to the linear characteristic of said first inverter, and
   a second quantizing circuit receiving an output from said second inverter and quantizing said second portion of said analog input voltage,
   wherein said first and second quantizing circuits each includes multiple thresholding devices arranged in a parallel configuration for simultaneously converting said first and second portions of said analog input voltage, respectively, into multiple levels of digital data, and
   wherein quantized outputs from said first and second quantizing circuits digitally represent said analog input voltage.

2. An A/D converter as claimed in claim 1, wherein said first and second inverters comprise serially connected CMOS inverters with an odd number of stages exceeding two.

3. An A/D converter as claimed in claim 1, wherein said multiple thresholding devices each have a different threshold varying in a stepwise fashion, and wherein, at least one of said thresholding circuits receives weighted outputs from all other of said thresholding circuits having a higher threshold than said at least one thresholding circuit so that an output generated by said at least one thresholding circuit repeatedly changes between an inverted and non-inverted state in a constant cycle as said input voltage is linearly changed.

4. An A/D converter as claimed in claim 1, wherein said thresholding circuits perform weighting using second capacitive couplings, a total capacity of each of said second capacitive couplings being equal.

5. An A/D converter as recited by claim 1, wherein said multiple thresholding devices are thresholding means.

6. An A/D converter as recited by claim 1, wherein the linear characteristics for the first and second inverter are the same.

* * * * *